United States Patent [19]

Nagaishi et al.

[11] Patent Number: 5,544,182
[45] Date of Patent: Aug. 6, 1996

[54] LASER SYSTEM FOR LASER ABLATION PROCESS AND LASER ABLATION PROCESS FOR PREPARING THIN FILM OF OXIDE SUPERCONDUCTOR MATERIAL THEREBY

[75] Inventors: Tatsuoki Nagaishi; Hideo Itozaki, both of Hyogo, Japan

[73] Assignee: Sumitomo Electric Industries, Ltd., Osaka, Japan

[21] Appl. No.: 229,716

[22] Filed: Apr. 19, 1994

[30]  Foreign Application Priority Data

Apr. 19, 1993  [JP]  Japan .................................. 5-115427

[51] Int. Cl.⁶ ........................................................ H01S 3/13
[52] U.S. Cl. ................................................ 372/29; 372/31
[58] Field of Search ............................................ 372/29, 31

[56]  References Cited

U.S. PATENT DOCUMENTS

| 4,730,105 | 3/1988 | Mitschke et al. | 372/31 |
| 4,866,243 | 9/1989 | Sakane et al. | 372/27 |
| 4,928,284 | 5/1990 | Burns | 372/31 |

FOREIGN PATENT DOCUMENTS

| 0265886 | 10/1987 | European Pat. Off. |
| 0499805 | 1/1992 | European Pat. Off. |
| 63-116481 | 5/1988 | Japan |
| 9119539 | 12/1991 | WIPO |

OTHER PUBLICATIONS

Materials Science and Engineering B, vol. B13, No. 1, 15 Mar. 1992, "Preparation of Y–Ba–Cu–O and Bi–Sr–Ca–Cu–O Thin Films and low temperature annealing effects" T. Brousse et al.

Applied Physics Letters, vol. 53, No. 26, Dec. 26, 1988 "Real-time monitoring of laser ablation deposition of superconductors by flourescence and secondary-ion spectra", pp. 2701–2703, Chen et al.

Primary Examiner—Rodney B. Bovernick
Assistant Examiner—Robert E. Wise
Attorney, Agent, or Firm—Kerkam, Stowell, Kondracki & Clarke, P.C.; John C. Kerins

[57]  ABSTRACT

A laser system comprising a laser oscillator emitting laser beam, and an attenuator disposed on a light path of the laser beam and damping intensity of the laser beam in which intensity of the laser beam can be controlled so as to maintain a required value after the attenuator.

4 Claims, 2 Drawing Sheets

LASER SYSTEM FOR LASER ABLATION PROCESS AND LASER ABLATION PROCESS FOR PREPARING THIN FILM OF OXIDE SUPERCONDUCTOR MATERIAL THEREBY

BACKGROUND OF THE INVENTION

1. Field of the invention

The present invention relates to a laser system for a laser ablation process and a laser ablation process for preparing a superconducting thin film by utilizing the laser system, and more specifically to a laser system suitable for laser ablation process and a laser ablation process for preparing a superconducting thin film formed of an oxide superconductor material by utilizing the laser system.

2. Description of Related Art

There are many processes for preparing thin films in which laser ablation processes have features that compositions of thin films can be easily controlled and that thin films can be deposited at high rate.

The laser ablation process is one of physical film deposition processes in which a target is exposed to a laser beam in a hermetic chamber which can be evacuated and into which arbitrary gasses can be supplied. A substrate is disposed to oppose the target in the chamber. When the target is exposed to the laser beam, a flame like plasma called plume is generated and a thin film is deposited on the substrate near a tip of the plume. High energy lasers such as excimer lasers or $CO_2$ lasers are used for the laser ablation.

Since no electromagnetic field which affects charged particles is needed, the laser ablation processes are suitable for preparing high quality thin films.

High critical temperature oxide superconductors recently advanced in study are plural compound oxides and their superconducting properties are significantly lowered if compositions deviate from proper values.

As mentioned above, compositions of thin films are easily controlled if the thin films are deposited by laser ablation processes. Therefore, it is studied to deposit oxide superconductor thin films having excellent properties by laser ablation processes.

In order to deposit high quality thin films by the laser ablation process, the laser beam should have identical intensity among each lot and from the beginning to the end of each process. If the intensity of the laser beam changes during the laser ablation process, a non-uniform thin film may be deposited. Space intensity distribution of the laser beam is also important. It is desired that the space intensity distribution of the laser beam is unchanged.

However, beam intensity of gas lasers such as excimer lasers gradually lower, when the lasers begin to oscillate. The reason is considered that conditions of the laser gases change, that mirrors of laser tubes become dirty by oscillating the lasers and that alignment of the mirrors of the laser tubes slightly deviates. In this case, the beam intensity can be restored by applying higher voltages to the laser tubes. However, when voltages applied to the laser tubes are changed, shapes of laser beams, namely, space intensity distributions of the laser beams are also changed.

Therefore, it is difficult to deposit thin films under the same condition among lots and from the beginning to the end of each process. By this, a little thin films having excellent properties can be obtained by the laser ablation process in the prior art.

SUMMARY OF THE INVENTION

Accordingly, it is an object of the present invention to provide a laser system for a laser ablation process, which have overcome the above mentioned defects of the conventional ones.

Another object of the present invention is to provide a laser ablation process for preparing a thin film by utilizing the laser system.

Still another object of the present invention is to provide a laser ablation process for preparing an oxide superconductor thin film by utilizing the laser system.

The above and other objects of the present invention are achieved in accordance with the present invention by a laser system comprising a laser oscillator emitting laser beam, and an attenuator disposed on a light path of the laser beam and damping intensity of the laser beam in which intensity of the laser beam can be controlled so as to maintain a required value after the attenuator.

It is preferable that the laser system further comprising a sensor determining intensity of the laser beam and a controlling means controlling damping factor of the attenuator on the basis of the intensity of the laser beam determined by the sensor so that intensity of the the laser beam maintains a required value after attenuator.

According to another aspect of the present invention, there is provided a method for operating laser system comprising a laser oscillator emitting laser beam, an attenuator disposed on a light path of the laser beam and damping intensity of the laser beam, a sensor determining intensity of the laser beam and a controlling means controlling damping factor of the attenuator on the basis of the intensity of the laser beam determined by the sensor in which setting damping factor of the attenuator to an initial value not equal to zero, decreasing the damping factor in proportion to decrease of the the intensity of the laser beam so as to maintain the intensity and shape of the laser beam constant after the attenuator.

The above and other objects, features and advantages of the present invention will be apparent from the following description of preferred embodiments of the invention with reference to the accompanying drawings.

DESCRIPTION OF THE PREFERRED EMBODIMENTS

Figure 1:
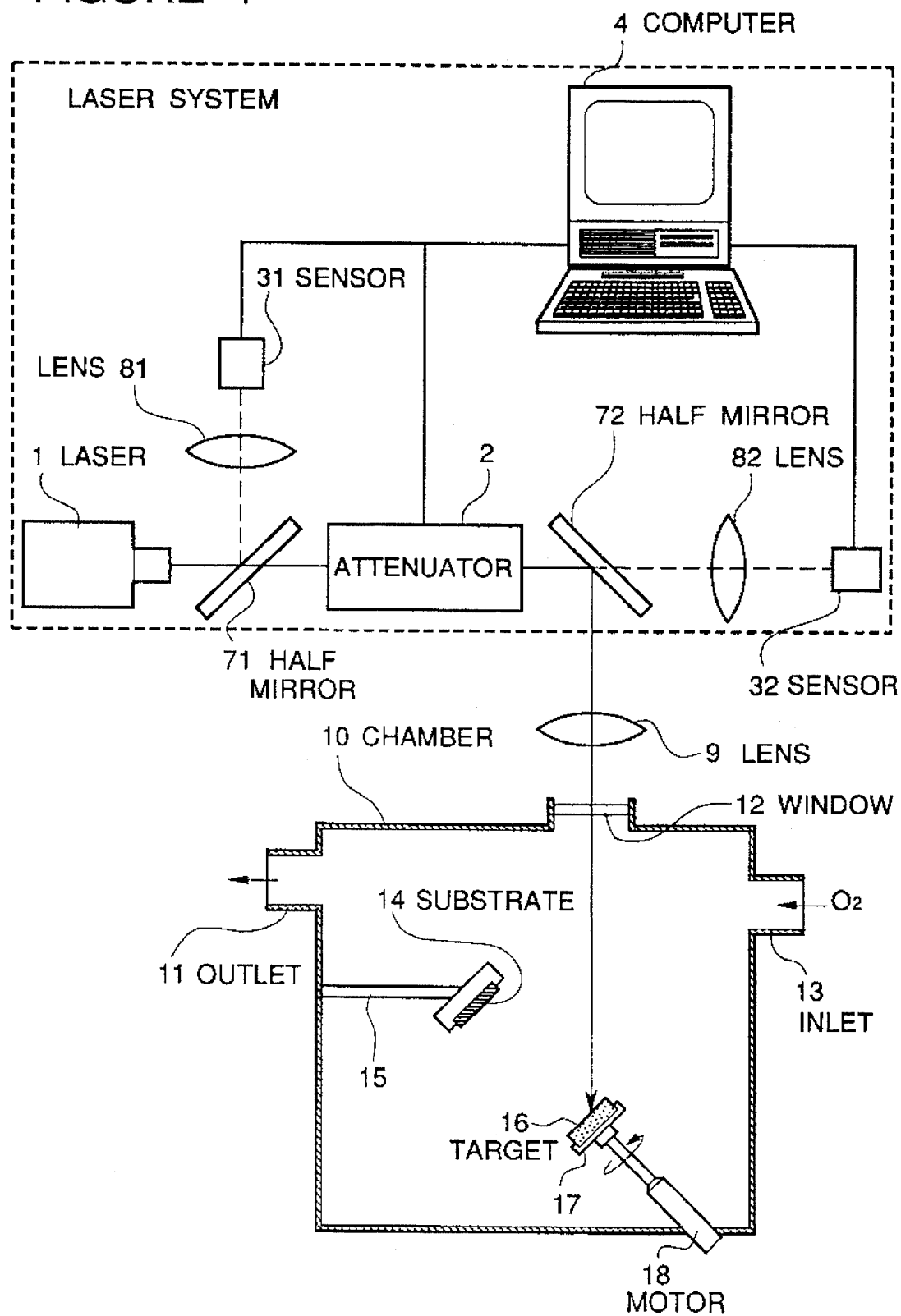
FIG. 1 is a diagrammatic view of a laser ablation apparatus which includes a preferred embodiment of the laser system in accordance with the present invention.

There is shown a diagrammatic view of a laser ablation apparatus which includes one preferred embodiment of the laser system in accordance with the present invention in FIG. 1. The laser system in accordance with the present invention includes a laser 1 such as an excimer laser or $CO_2$ laser and following elements disposed on a light path of the laser 1; a half mirror 71 which reflects a part of laser beam oscillated by the laser 1 and transmits the remainder, an attenuator 2 attenuating the laser beam passing through the half mirror 71, and a half mirror 72 which transmits a part of the laser beam from the attenuator 2 and reflects the remainder. The laser system further includes a lens 81 focusing a pan of the laser beam which is reflected by the half mirror 71, a lens 82 focusing a part of the laser beam which passes through the half mirror 72, a sensor 31 disposed near a focus of the lens 81 and determining intensity of the focused laser beam, a sensor 32 disposed near a focus of the lens 82 and determining intensity of the focused laser beam and a computer 4 controlling damping factor of the attenuator 2 on the basis of the intensity of the laser beam determined by the sensors 31 and 32.

An energy meter which determines intensity of the laser beam by converting laser beam into heat, a biplanar type photoelectric tube and a photodiode can be used for the sensors 31 and 32. In this embodiment, the damping factor of the attenuator 2 is controlled by the computer 4. However, the damping factor of the attenuator 2 may be also controlled by hand or an arbitrary automatic control means. If the damping factor of the attenuator 2 is controlled by a computer, it is favorable that control functions of the damping factor can be easily changed by changing software so as to adjust themselves to change of laser, change of specifications of laser, change of operating conditions, etc.

The laser ablation apparatus comprises the above laser system in accordance with the present invention, a lens 9 focusing the laser beam reflected by the half mirror 72 and a chamber 10 having a window 12 transparent for the laser beam. The chamber 10 comprises an inlet 13 and an outlet 11 so that arbitrary gases are supplied to the chamber 10 through the inlet 13 and the chamber 10 is evacuated through the outlet 11. Therefore, an atmosphere and a gas pressure of the chamber 10 can be controlled at will. The chamber 10 further comprises a substrate holder 15 on which a substrate 14 is secured, a target holder 17 on which a target 16 is secured in parallel with the substrate 14. The substrate holder 15 is equipped with a heater (not shown) so as to heat the substrate 14. The target holder 17 rotates by a motor 18 so as to prevent only one portion of the target 16 from being exposed to the laser beam.

In the above laser ablation apparatus, laser beam oscillated by the laser 1 is partially reflected the half mirror 71 and focused on the sensor 31 by the lens 81. The remainder of the laser beam is transmitted by the half mirror 71 and damped by the attenuator 2. The laser beam damped by the attenuator 2 is partially transmitted by the half mirror 72 and is focused on the sensor 32 by the lens 82. The remainder of the damped laser beam is reflected by the half mirror 72 and focused on the target 16 in the chamber 10 by a lens 9.

When the target 16 is irradiated with focused laser beam, plasma called plume rises on the target 16 to the substrate 14 so that a thin film is deposited on the heated substrate 14. The sensors 31 and 32 determine intensity of the laser beam reflected by the half mirror 71 and the one passing through the half mirror 72. When the intensity of the laser beam changes, the computer 4 sends a control signal to the attenuator 2 to change the damping factor so as to cancel the intensity change of the laser beam.

Figure 2:
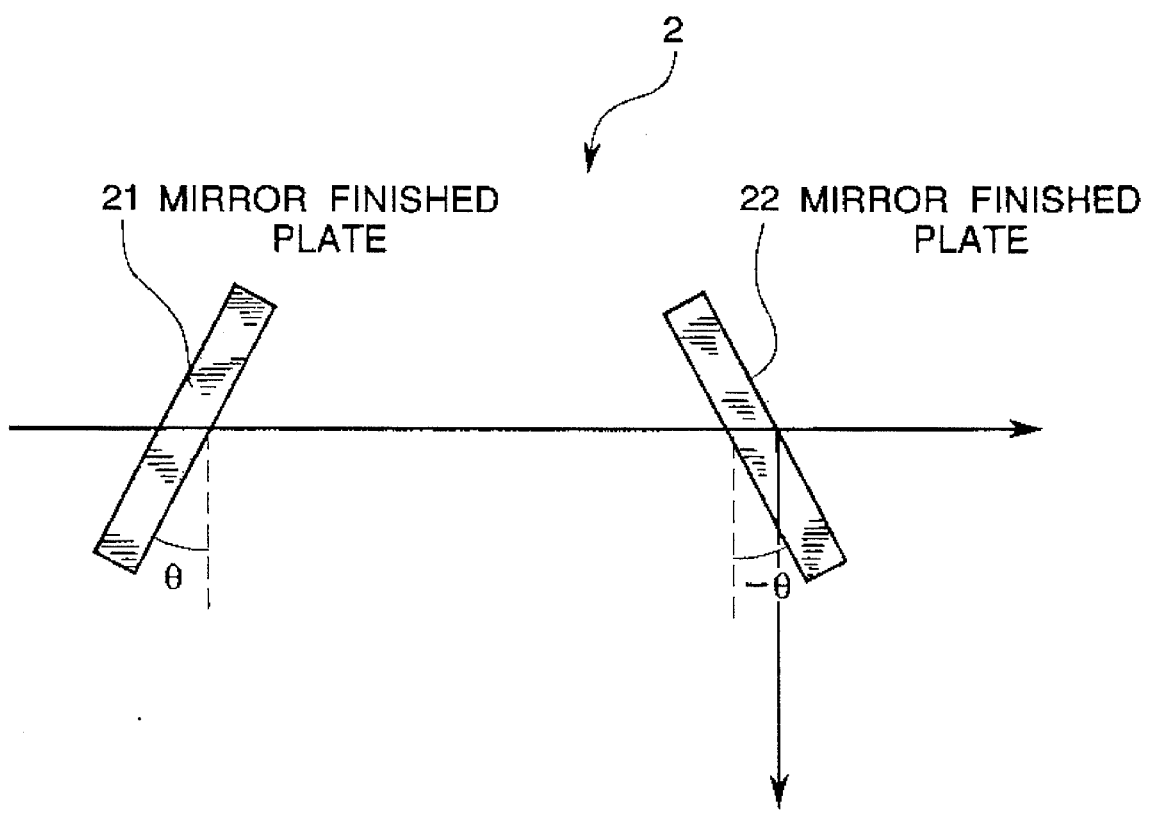
FIG. 2 is a diagrammatic view for illustrating one embodiment of the attenuator of the laser system shown in FIG. 1.

There is shown a diagrammatic view of an embodiment of the attenuator 2 in FIG. 2. The attenuator shown in FIG. 2 comprises two mirror finished plates 21 and 22 of artificial quartz opposed each other and respectively inclined at angles of θ and −θ to a vertical line. Both surfaces of the mirror finished plates 21 and 22 are mirror finished and the both surfaces of the mirror finished plate 21 are coated with anti-reflection coating. Only a surface of the mirror finished plate 22 opposed to the mirror finished plate 21 is coated with anti-reflection coating. The mirror finished plates 21 and 22 can be also formed of $MgF_2$ or $CaF_2$.

The mirror finished plates 21 and 22 are connected by a linkage (not shown) and to a moving means (not shown) such as a servo motor so that their tilt angles θ and −θ are changed by the control signal from the computer 4 with maintaining their relations. Namely, the mirror finished plates 21 and 22 are always inclined at angles of θ and −θ to the vertical line when θ is changed.

The laser beam passes through the mirror finished plate 21 from left side of the figure to the mirror finished plate 22. The mirror finished plate 22 partially reflects the laser beam at the non-anti-reflection coating surface and transmits the remainders. The ratio between reflection and transmission can be changed by changing the tilt angles θ and −θ of the mirror finished plates 21 and 22. The mirror finished plate 21 prevents the light path of the laser beam from deviating.

In this embodiment, an ArF excimer laser (wave length: 193 nanometers) is used for the laser 1, the half mirror 71 reflects 10% of the laser beam and transmits the remainder, the half mirror 72 transmits 10% of the laser beam and reflects the remainder, and photodiodes for ultraviolet rays are used for the sensors 31 and 32.

In general, an excimer laser oscillates the most intensive laser beam at the beginning of an operation and intensity of the laser beam gradually decreases. In the above laser system, at first, damping factor of the attenuator 2 is set to an initial value and is controlled to become smaller so as to cancel decrease of intensity of the laser beam. The initial value of the damping factor of the attenuator 2 is preferably a ratio between the estimated intensity of the laser beam at the beginning of art operation and at the end of the operation. In other words, it is preferable that the initial value of the damping factor is set so that the laser beam is not damped at all at the end of the operation.

EXAMPLE 1

The above laser system according to the present invention was operated in accordance with the present invention. Operation duration was one hour, intensity of the laser beam at the beginning of the operation was set to 0.6 Joul/pulse and pulse rate was set to 100 Hz. An initial value of the damping factor of the attenuator (not including damping of the attenuator by itself) was set to 0.67. This value was determined by the fact that the intensity of the laser beam became on the order of 0.4 Joule/pulse after continuous one hour operation.

When the laser beam was oscillated, the intensity of the laser beam gradually decreased, so as to become 0.4 Joule/pulse. However, intensity of the laser beam after the attenuator 2 was maintained 0.36±0.01 Joul/pulse (including 10% damping of the attenuator by itself) for one hour. In addition, a shape of beam was kept uniform for one hour.

EXAMPLE 2

Ten $Y_1Ba_2Cu_3O_{7-x}$ oxide superconductor thin films were deposited by laser ablation process in accordance with the present invention by using the apparatus shown in FIG. 1. In this example, the laser was intermittently oscillated, but was operated for a long time.

Intensity of the laser beam at the beginning of the operation was set to 0.6 Joul/pulse and pulse rate was set to 10 Hz. An initial value of the damping factor of the attenuator was set to 0.6. This value was determined by the facts that excimer laser beam having intensity of 0.3 to 0.4 Joule/pulse was emitted at a pulse rate of 10 Hz for 10 minutes for depositing a $Y_1Ba_2Cu_3O_{7-x}$ oxide superconductor thin film, that it took one hour to adjust atmosphere of the chamber for each process for depositing a $Y_1Ba_2Cu_3O_{7-x}$ oxide superconductor thin film and that intensity of the laser beam of the excimer laser apparatus used in this embodiment decreased at 5% per pulse at every one hour, when it was oscillated for 10 minutes at one hour intervals. Namely, the initial value was determined from a formula of $0.95^{10} \approx 0.6$.

While depositing ten $Y_1Ba_2Cu_3O_{7-x}$ oxide superconductor thin films, intensity of the laser beam after the attenuator 2 was maintained 0.36±0.03 Joul/pulse (including 10% damping of the attenuator by itself). In addition, a shape of beam was kept uniform.

The other conditions of the laser ablation process were as follows;

| | |
|---|---|
| Target | Sintered $Y_1Ba_2Cu_3O_{7-x}$ |
| Substrate | $LaAlO_3$ single crystal substrate |
| Temperature of substrate | 700° C. |
| Pressure | 400 mTorr ($O_2$) |
| Thickness of the thin film | 200 nanometers |

Variation in thickness of the ten $Y_1Ba_2Cu_3O_{7-x}$ oxide superconductor thin films was within 5% and all the ten $Y_1Ba_2Cu_3O_{7-x}$ oxide superconductor thin films had critical temperatures higher than 90 K.

However, variation in thickness of ten $Y_1Ba_2Cu_3O_{7-x}$ oxide superconductor thin films deposited by a conventional laser apparatus in which intensity of laser beam was controlled by changing high voltage applied to a laser tube was ±10% and the thin films had critical temperatures of 87 to 90 K.

As explained above, in accordance with the present invention, there is provided a laser system of which intensity and shape of laser beam are not changed when it is continuously or intermittently operated for long time and an operating procedures thereof. If oxide superconductor thin films are prepared by a laser ablation process using the laser system in accordance with the present invention, more uniform oxide superconductor thin films can be obtained. In addition, if the laser system in accordance with the present invention is applied to fine processings, surface treatments, lithography, or etc., it is possible to conduct processings of higher quality.

In the above embodiment, only about a $Y_1Ba_2Cu_3O_{7-x}$ oxide superconductor thin film is described. However, the oxide superconductor thin film can be formed of a high-$T_c$ (high critical temperature) oxide superconductor material, particularly a high-$T_c$ copper-oxide type compound oxide superconductor material, for example a Ln—Ba—Cu—O (Ln means a lanthanoide) compound oxide superconductor material, a Bi—Sr—Ca—Cu—O compound oxide superconductor material, and a Tl—Ba—Ca—Cu—O compound oxide superconductor material other than $Y_1Ba_2Cu_3O_{7-x}$ oxide superconductor material.

The substrate can be formed of for example, an insulator substrate such as a MgO (100) substrate, a $SrTiO_3$ (100) substrate, $LaAlO_3$ (100) substrate, a $CdNdAlO_4$ (001) substrate or others.

The invention has thus been shown and described with reference to the specific embodiments. However, it should be noted that the present invention is in no way limited to the details of the illustrated structures but converts and modifications may be made within the scope of the appended claims.

We claim:

1. A laser system comprising:

a laser oscillator adapted to emit a laser beam;

an attenuator disposed along a light path of a laser beam emitted from said laser oscillator;

two sensors disposed along the light path of the laser beam, a first sensor being positioned upstream of said attenuator and a second sensor being disposed downstream of said attenuator and wherein said first and second sensors determine intensity of the laser beam before and after the attenuator, respectively; and a controller for controlling a damping factor of the attenuator in response to the sensed intensity of the laser beam as determined by the sensor, wherein said attenuator, sensors and controller provide means for damping and controlling an intensity of said laser beam to maintain said intensity at a required value in a portion of the system downstream of the attenuator, while keeping a shape of said laser beam constant.

2. A laser system as claimed in claim 1, wherein the sensor is disposed along the light path of the laser beam downstream of the attenuator and determines the intensity of the laser beam downstream of the attenuator.

3. A laser system as claimed in claim 1, wherein said controller comprises a computer.

4. A method for operating a laser system having a laser oscillator which emits a laser beam and an attenuator disposed along a light path of the laser beam, the method comprising:

setting a damping factor of said attenuator to an initial maximum value not equal to zero, wherein said initial value is calculated from a ratio between intensities of said laser beam at the beginning of operation and at the end of operation;

sensing an intensity of the laser beam;

controlling the damping factor of said attenuator based upon said sensed laser beam intensity by decreasing said damping factor of said attenuator in proportion to any decrease in the sensed laser beam intensity, so as to maintain constant the intensity and a shape of said laser beam downstream of said attenuator.

* * * * *